US 8,203,474 B2

(12) United States Patent
Ogita et al.

(10) Patent No.: US 8,203,474 B2
(45) Date of Patent: Jun. 19, 2012

(54) PIPELINE A/D CONVERTER

(75) Inventors: Shinichi Ogita, Osaka (JP); Akira Kawabe, Osaka (JP); Takayasu Kito, Osaka (JP)

(73) Assignee: Panasonic Corporation, Osaka (JP)

( * ) Notice: Subject to any disclaimer, the term of this patent is extended or adjusted under 35 U.S.C. 154(b) by 122 days.

(21) Appl. No.: 12/935,387

(22) PCT Filed: Mar. 3, 2009

(86) PCT No.: PCT/JP2009/000959
§ 371 (c)(1),
(2), (4) Date: Sep. 29, 2010

(87) PCT Pub. No.: WO2009/122656
PCT Pub. Date: Oct. 8, 2009

(65) Prior Publication Data
US 2011/0025536 A1   Feb. 3, 2011

(30) Foreign Application Priority Data
Mar. 31, 2008   (JP) ................................. 2008-091992

(51) Int. Cl.
*H03M 1/10* (2006.01)
(52) U.S. Cl. ......... 341/120; 341/118; 341/162; 341/172
(58) Field of Classification Search ................. 341/118, 341/120, 161–163, 172
See application file for complete search history.

(56) References Cited

U.S. PATENT DOCUMENTS

| 5,784,016 | A | 7/1998 | Nagaraj | |
| 7,821,433 | B2* | 10/2010 | Abe | 341/118 |
| 2005/0116846 | A1* | 6/2005 | Bogner | 341/118 |
| 2006/0044173 | A1 | 3/2006 | Dosho et al. | |
| 2006/0049973 | A1 | 3/2006 | Dosho et al. | |
| 2006/0227025 | A1* | 10/2006 | El-Sankary et al. | 341/120 |
| 2006/0279448 | A1* | 12/2006 | Lu | 341/161 |
| 2007/0008282 | A1 | 1/2007 | Ogita et al. | |
| 2009/0015455 | A1* | 1/2009 | Oshima et al. | 341/172 |
| 2011/0193736 | A1* | 8/2011 | Buter et al. | 341/172 |

FOREIGN PATENT DOCUMENTS

| JP | 2004-222274 | 8/2004 |
| JP | 2006-67201 | 3/2006 |
| JP | 2006-80717 | 3/2006 |
| JP | 2006-109403 | 4/2006 |
| JP | 2007-13885 | 1/2007 |

* cited by examiner

*Primary Examiner* — Howard Williams
(74) *Attorney, Agent, or Firm* — Hamre, Schumann, Mueller & Larson, P.C.

(57) ABSTRACT

In each stage, a digital signal corresponding to a portion of bits is generated from an input analog signal, an analog reference signal is generated by a DA conversion portion (7, 8) based on the digital signal, and a remainder operation on the input analog signal is performed by a remainder operation portion (9). A test can be performed by supplying a test signal in place of the input analog signal. A control portion (14a) performs control, in a test mode, to stop supply of the input analog signal to the remainder operation portion and stop the reference voltage selection of the DA conversion portion based on the digital signal, while performing reference voltage selection based on a DA conversion control signal for use in testing, thereby supplying the remainder operation portion with the test signal composed of predetermined one of the reference voltages, in place of the input analog signal, and the analog reference signal. A test signal can be input with a small-scale configuration, without providing a test signal line separately from a line used for normal operation.

7 Claims, 15 Drawing Sheets

| Sampling Period | | | Amplifying Period | | | | Vout | |
|---|---|---|---|---|---|---|---|---|
| Vin (×Vref) | Voltage Supply Portion | | Vdac | Voltage Supply Portion | | | | |
| | Main | Aux | S | | Main | Aux | S | | |
| -1/4 | 0 | -1 | ON | -1 | -1 | 0 | OFF | +0.5Vref | P1 |
| | | | | 0 | 0 | 0 | OFF | -0.5Vref | P2 |
| +1/4 | 0 | +1 | ON | 0 | 0 | 0 | OFF | +0.5Vref | P3 |
| | | | | 1 | +1 | 0 | OFF | -0.5Vref | P4 |

| | φ1 Timing (Sampling) | φ2 Timing (Amplifying) |
|---|---|---|
| Normal Operation | Vin—Cf, Cs, Cc, 0 | Vdac [−Vref, 0, +Vref]—Cf, Cs, Cc, 0 — Vout |
| Test Mode 1 | 0—Cf, 0—Cs, −Vref—Cc | −Vref—Cf, Cs, Cc, 0 — Vout |
| Test Mode 2 | 0—Cf, 0—Cs, −Vref—Cc | 0—Cf, Cs, Cc, 0 — Vout |

FIG. 8

| Vin (×Vref) | Sampling Period | | | | | | | | | Vdac | Amplifying Period | | | | | | | | |
|---|---|---|---|---|---|---|---|---|---|---|---|---|---|---|---|---|---|---|---|
| | Voltage Supply Portion | | | | | | | | | | Voltage Supply Portion | | | | | | | | |
| | 1 | 2 | 3 | 4 | 5 | 6 | 7 | 8 | c | | 1 | 2 | 3 | 4 | 5 | 6 | 7 | 8 | c |
| −15/16 | 0 | −1 | −1 | −1 | −1 | −1 | −1 | −1 | −1 | −8 | −1 | −1 | −1 | −1 | −1 | −1 | −1 | −1 | 0 |
| | | | | | | | | | | −7 | 0 | −1 | −1 | −1 | −1 | −1 | −1 | −1 | 0 |
| −13/16 | −1 | 1 | −1 | −1 | −1 | −1 | −1 | −1 | −1 | −7 | 0 | −1 | −1 | −1 | −1 | −1 | −1 | −1 | 0 |
| | | | | | | | | | | −6 | −1 | −1 | −1 | −1 | −1 | −1 | −1 | 1 | 0 |
| −11/16 | 0 | 1 | −1 | −1 | −1 | −1 | −1 | −1 | −1 | −6 | −1 | −1 | −1 | −1 | −1 | −1 | −1 | 1 | 0 |
| | | | | | | | | | | −5 | 0 | −1 | −1 | −1 | −1 | −1 | −1 | 1 | 0 |
| −9/16 | −1 | 1 | 1 | −1 | −1 | −1 | −1 | −1 | −1 | −5 | 0 | −1 | −1 | −1 | −1 | −1 | −1 | 1 | 0 |
| | | | | | | | | | | −4 | −1 | −1 | −1 | −1 | −1 | −1 | 1 | 1 | 0 |
| . . . . . | | | | | | | | | | | | | | | | | | | |
| −1/16 | −1 | 1 | 1 | 1 | 1 | −1 | −1 | −1 | −1 | −1 | 0 | −1 | −1 | −1 | −1 | 1 | 1 | 1 | 0 |
| | | | | | | | | | | 0 | −1 | −1 | −1 | −1 | 1 | 1 | 1 | 1 | 0 |
| +1/16 | 0 | 1 | 1 | 1 | 1 | −1 | −1 | −1 | −1 | 0 | −1 | −1 | −1 | −1 | 1 | 1 | 1 | 1 | 0 |
| | | | | | | | | | | 1 | −1 | −1 | −1 | −1 | 1 | 1 | 1 | 1 | 0 |
| . . . . . | | | | | | | | | | | | | | | | | | | |
| +9/16 | 0 | 1 | 1 | 1 | 1 | 1 | 1 | −1 | −1 | 4 | −1 | −1 | 1 | 1 | 1 | 1 | 1 | 1 | 0 |
| | | | | | | | | | | 5 | 0 | −1 | 1 | 1 | 1 | 1 | 1 | 1 | 0 |
| +11/16 | −1 | 1 | 1 | 1 | 1 | 1 | 1 | 1 | −1 | 5 | 0 | −1 | 1 | 1 | 1 | 1 | 1 | 1 | 0 |
| | | | | | | | | | | 6 | −1 | 1 | 1 | 1 | 1 | 1 | 1 | 1 | 0 |
| +13/16 | 0 | 1 | 1 | 1 | 1 | 1 | 1 | 1 | −1 | 6 | −1 | 1 | 1 | 1 | 1 | 1 | 1 | 1 | 0 |
| | | | | | | | | | | 7 | 0 | 1 | 1 | 1 | 1 | 1 | 1 | 1 | 0 |
| +15/16 | −1 | 1 | 1 | 1 | 1 | 1 | 1 | 1 | −1 | 7 | 0 | 1 | 1 | 1 | 1 | 1 | 1 | 1 | 0 |
| | | | | | | | | | | 8 | 1 | 1 | 1 | 1 | 1 | 1 | 1 | 1 | 0 |

FIG. 15

PIPELINE A/D CONVERTER

BACKGROUND OF THE INVENTION

1. Field of the Invention

The present invention relates to a pipeline A/D converter, and more particularly to a technique for correcting an output thereof.

2. Description of Related Art

Following digitization in the fields of audiovisual, information communications, and the like, faster speeds and higher resolution are required in AD converters, which are key devices. Pipeline AD converters have been much used in recent years as excellent circuits in terms of speed and power consumption. However, with the increasing performance of devices, greater accuracy is sought in pipeline AD converters, together with high speed, low voltage, multi-bit conversion and low cost.

FIG. 16 is a block diagram showing the basic configuration of a pipeline A/D converter. This pipeline A/D converter includes n stages, that is, a first stage 1[1] to an nth stage 1[n], that are connected in cascade, and a flash AD converter 2 as a final stage. An input analog signal Vin is converted to a digital signal one bit at a time from a most significant bit to a least significant bit by the n stages. An output signal resulting from the input analog signal elm being A/D converted with a desired number of bits is obtained as a result of output digital signals of the n stages and the flash AD converter 2 being combined by a digital operation portion 6.

While only the configuration of the first stage 1[1] is shown in detail in FIG. 16, the configuration of the other stages is similar. That is, each stage is constituted by an AD conversion portion 3, a DA conversion portion 4, and a remainder operation portion 5.

The AD conversion portion 3 generates and outputs a digital signal obtained by ternarizing an analog signal input to the stage, and also supplies the digital signal to the DA conversion portion 4. The DA conversion portion 4 generates an analog reference signal based on the digital signal output by the AD conversion portion 3, and supplies the analog reference signal to the remainder operation portion 5. The remainder operation portion 5 generates a remainder analog signal by subtracting the analog reference signal output by the DA conversion portion 4 and performing amplification, with respect to the input analog signal of the stage, and supplies the remainder analog signal to the next stage as an input analog signal.

FIG. 17 shows a circuit for obtaining a prescribed function using the DA conversion portion 4 and the remainder operation portion 5. The DA conversion portion 4 is composed of a logical operation portion 7 and a voltage supply portion 8. The other elements, that is, an operational amplifier 9, a sampling capacitor Cs, a feedback loop capacitor Cf, and switches 10 to 12 constitute the remainder operation portion 5 in FIG. 16. The analog reference signal output by the DA conversion portion 4 is supplied to a connection node between the sampling capacitor Cs and the switch 10. Also, the operational amplifier 9 side of the sampling capacitor Cs is connected to a bias0 via a switch 15. Note that in the following description, the capacitance values of the sampling capacitor Cs and the feedback loop capacitor Cf respectively will be represented by Cs and Cf.

The voltage supply portion 8 selects and supplies ternary reference voltages +Vref, 0V and −Vref by switching three switches. The logical operation portion 7 outputs a signal for switching the switches of the voltage supply portion 8, based on a value of the digital signal output from the AD conversion portion 3. In the voltage supply portion 8, one of the ternary reference voltages is selected according to the value of the digital signal, and supplied as an analog reference signal Vdac.

This circuit performs operations of a sampling period and an amplifying period, as a result of a clock φ1 and a clock φ2 shown in FIG. 17 alternately taking high level (H) and low level (L) values. In a state where the clock φ1 is H and the clock φ2 is L, the switches 10 and 11 are on and the switch 12 is off, resulting in the input analog signal Vin being sampled in the sampling capacitor Cs. In a state where the clock φ1 is L and the clock φ2 is H, the switches 10 and 11 will be off and the switch 12 will be on, resulting in the charge sampled in the sampling capacitor Cs being redistributed to the sampling capacitor Cs and the feedback loop capacitor Cf. Also, the logical operation portion 7 operates and the analog reference signal Vdac is supplied from the voltage supply portion 8 to the sampling capacitor Cs. As a result, an output signal Vout amplified by the operational amplifier 9 will be as follows:

$$Vout = \{(Cs+Cf)/Cf\} \cdot Vin - (Cs/Cf) \cdot Vdac \quad (1)$$

If Cs=Cf is set, then:

$$Vout = 2 \cdot Vin - Vdac \quad (2)$$

This output signal Vout of the operational amplifier 9 will be described in more detail with reference to the input-output characteristics of FIG. 18. The horizontal axis in FIG. 18 shows the input analog signal Vin supplied to each stage. The vertical axis shows the output signal Vout of the operational amplifier 9. As shown in this figure, the level of the input analog signal Vin on the horizontal axis is sectioned into a first range (−Vref to −Vref/4), a second range (−Vref/4 to +Vref/4), and a third range (+Vref/4 to +Vref).

The AD conversion portion 3 generates a ternary digital signal from the input analog signal Vin, using a reference voltage corresponding to the boundary of each range. In the voltage supply portion 8, one of the voltages +Vref, 0V and −Vref is selected, using a control signal output by the logical operation portion 7 based on this digital signal. Further, as a result of the operation of the equation (2), the input-output characteristics of the output signal Vout of the operational amplifier 9 relative to the input analog signal Vin will be as shown in FIG. 18.

In this way, the output signal Vout of the operational amplifier 9 can be prevented from exceeding the input range of the AD conversion portion 3 of the next stage 1, by generating an analog reference signal according to the level of the input analog signal Vin, and performing addition/subtraction with respect to the input analog signal Vin. Also, when the capacitance values of the sampling capacitor Cs and the feedback loop capacitor Cf are equal, as mentioned above, the analog input-output characteristics of each stage will be ideal. That is, a gain by the operational amplifier 9 will be exactly "2", and a discontinuous width in a nonlinear portion (portion where Vin=±Vref/4) of the characteristics in FIG. 18 will be a Vref equivalent to exactly one bit.

However, in practice, a slight error exists between the capacitance values of the sampling capacitor Cs and the feedback loop capacitor Cf. An error occurs in the gain caused by this capacitance value error, and the analog input-output characteristics of the stage end up differing from the prescribed characteristics. That is, when Cf<Cs, the discontinuous width will be greater than one bit, and when Cf>Cs, the discontinuous width will be less than one bit.

The above capacitance value error is the main cause of a degradation in analog input-output characteristics of a stage, and eliminating this error will lead to improvement in the conversion accuracy of a pipeline A/D converter. However, in the case where the resolution of the pipeline A/D converter is 12 bits or more, the tolerable error will be no more than around 0.04%. Correcting this error in the analog signal region is extremely difficult, and so requires error correction using digital processing.

A pipeline A/D converter such as shown in FIG. 19 is disclosed in JP 2006-67201A, as an example of a configuration for performing correction of conversion errors caused by such capacitance value errors. This A/D converter includes a plurality of stages 30 and variable stages 30A, a digital calculation portion 31, a control portion 32, a plurality of input switching portions 33, a stage evaluation portion 34, a plurality of correction value computing portions 35, and an output correction portion 36. The stages 30 and the variable stages 30A have similar functions to the above-mentioned stages. The digital calculation portion 31 is provided with digital calculation cores 31a that correspond with the stages and add the digital output of the corresponding stage to the result of shifting the digital output from the previous stage by 1 bit.

The control portion 32 controls operation of the group of switches in each input switching portion 33 and each variable stage 30A. The input switching portions 33 are provided in correspondence with the variable stages 30A, and switch the input of the corresponding variable stages 30A between a normal input signal and a test signal, under the control of the control portion 32. The normal input signal refers to an analog signal input to each stage when performing a normal conversion operation. The test signal is an analog signal of a prescribed size for detecting capacitance value errors in a stage. The test signal is, for example, generated using a D/A converter or the like (not shown).

The stage evaluation portion 34 estimates an analog output error of each variable stage 30A, based on the digital output of the output correction portion 36. That is, in a state where a test signal has been input to a variable stage 30A (test stage) whose capacitance value error is to be estimated, a conversion error of a size that depends on the capacitance value error of the test stage is included in the digital output obtained from the pipeline A/D converter. Accordingly, the analog output error is estimated from this digital output.

The correction value computing portions 35 are provided in correspondence with the variable stages 30A, and generate output error characteristics for the variable stages 30A, based on the capacitance value errors estimated by the stage evaluation portion 34. Based on these characteristics, the correction value computing portions 35 compute digital output errors for the corresponding variable stages 30A as digital correction values, using intermediate outputs of the digital calculation portion 31 input via delay elements 37.

The output correction portion 36 corrects the digital outputs of the digital calculation portion 31, based on the digital correction values output from the correction value computing portions 35.

In this way, with regard to each variable stage 30A, an output error caused by the capacitance value error between the feedback loop capacitor and the sampling capacitor in the variable stage 30A is estimated, and a digital correction value is computed based on this estimated error. The digital output of the pipeline A/D converter is then corrected using these digital correction values.

Also, in JP 2007-13885A, a specific configuration for supplying a test signal such as mentioned above is disclosed.

SUMMARY OF THE INVENTION

With the configuration of the above conventional example, a test signal input line for supplying the test signal needs to be provided, in order to perform the correction of conversion errors caused by capacitance value errors. Also, means such as a DA converter is required externally to the A/D converter, in order to generate the test signal.

However, if a test signal is supplied via a test signal input line, problems arise with the accuracy of the supplied test signal. That is, the test signal will not be in the same state as the analog signal actually input, since the test signal input line differs from the line for supplying the normal input analog signal, and signal degradation caused by the length of the test signal input line and parasitic elements also arises. High accuracy with regard to an evaluation result based on the test signal cannot be expected when the accuracy of the test signal is poor.

By providing means for generating a test signal externally to the A/D converter, an increase in circuit size is unavoidable, and the evaluation result is also influenced by the characteristics of this test signal generating means.

Note that the supply of a test signal to a stage also is used when performing various types of tests for correcting stage difference errors, gain errors and offset errors in an AD converter, as well as for checking and evaluation purposes, apart from for correcting capacitance value errors such as in the above conventional example.

Accordingly, an object of the present invention is to provide a pipeline A/D converter capable of using a small-scale configuration to input a test signal supplied to a stage in order to perform various types of tests, without providing a test signal line separately from a line used for normal operation.

A pipeline A/D converter of the present invention has a plurality of stages connected in cascade, each of which performs A/D conversion corresponding to a portion of bits, such that an analog signal input to a first one of the stages is converted to a digital signal sequentially from a most significant bit to a least significant bit through the plurality of stages.

Each of the stages includes: an AD conversion portion that generates a digital signal corresponding to a portion of bits by quantizing an input analog signal of the stage; a DA conversion portion comprising a voltage supply portion that selects a reference voltage from reference voltages of a plurality of levels and outputs the selected reference voltage, and a logical operation portion that outputs a signal for controlling selection by the voltage supply portion based on the digital signal generated by the AD conversion portion, thereby outputting the selected reference voltage as an analog reference signal; and a remainder operation portion that generates a remainder analog signal by performing addition/subtraction of the analog reference signal with respect to the input analog signal and amplification by a predetermined factor, and supplies the remainder analog signal to a next one of the stages as an input analog signal.

The pipeline A/D converter is configured such that a test can be performed by supplying a test signal in place of the input analog signal, with respect to at least a portion of the stages.

In order to solve the above problems, the pipeline A/D converter of the present invention further includes a control portion capable of controlling supply of the input analog signal to the remainder operation portion and selection of the reference voltage by the DA conversion portion, according to a normal operation mode and a test mode, respectively. The remainder operation portion includes an input switch that controls input of the input analog signal, an operational amplifier, a sampling capacitor, one end of which is connected to an input terminal of the operational amplifier and another end of which is connected to the input switch, and a feedback loop capacitor connected between the input terminal and an output terminal of the operational amplifier via a feedback changing switch. DA conversion portion includes an auxiliary voltage supply portion that selects and outputs a reference voltage from the reference voltages of the plurality of levels, and an auxiliary capacitor, one end of which is connected to the input terminal of the operational amplifier and another end of which is connected to the auxiliary voltage supply portion.

The control portion is capable of selecting one of the output signal of the logical operation portion and the DA conversion control signal, so as to control the reference voltage selection by the voltage supply portion using one of the signals, and performs control, in the test mode, to stop supply of the input analog signal to the remainder operation portion by turning off the input switch and stop the reference voltage selection of the DA conversion portion based on the digital signal as well, while performing reference voltage selection based on the DA conversion control signal for use in testing, thereby supplying a downstream path of the input switch in the remainder operation portion with the test signal composed of predetermined one of the reference voltages, in place of the input analog signal, and the analog reference signal.

When in the test mode, the control portion performs control so as to supply output voltages of the voltage supply portion and the auxiliary voltage supply portion to the remainder operation portion. During a sampling period of the remainder operation portion in the test mode, the control portion performs control to sample the test signal using the sampling capacitor, while controlling the feedback changing switch to be off. During an amplifying period of the remainder operation portion in the test mode, the control portion performs control to input the selected analog reference signal to the sampling capacitor, while controlling the feedback changing switch to be on, thereby performing a predetermined operation between the sampled test signal and the analog reference signal.

According to a pipeline A/D converter having the above configuration, test signals and analog reference signals can be supplied by sharing a voltage supply portion in a normal operation mode and a test mode, without providing a test signal line for supplying test signals. Accordingly, test signals can be supplied accurately. Also, since the voltage supply portion is shared, there is no need to provide means for generating test signals such as a DA converter externally to the A/D converter, and an increase in circuit size can be suppressed.

BRIEF DESCRIPTION OF THE DRAWINGS

FIG. 8 contrasts the states of a remainder operation portion of the stage when in a normal operation mode and a test mode.

FIG. 15 shows an example of state transitions of the stage in a sampling period and an amplifying period when in a test mode.

DETAILED DESCRIPTION OF THE INVENTION

The disclosure of Japanese Patent Application No. 2008-091992 filed Mar. 31, 2008, including the specification, drawings and claims, is incorporated herein by reference in its entirety.

A pipeline A/D converter of the present invention can be modified as follows, with the above configuration as a basis.

That is, in the above configuration, preferably the pipeline A/D converter further includes a bias switching switch, one end of which is connected between the feedback loop capacitor and the feedback changing switch, and another end of which is connected to a bias voltage, wherein the control portion controls the bias switching switch to be on during the sampling period of the remainder operation portion when in the test mode.

In the above configuration, the pipeline A/D converter can be configured such that a capacitance value $Cc$ of the auxiliary capacitor satisfies a relation $Cc = a \times Cs$ or $Cc = a \times Cf$ (a being a constant where $0 < a \leq 1$), with respect to a capacitance value $Cs$ of the sampling capacitor or a capacitance value $Cf$ of the feedback loop capacitor.

In any of the above configurations, the pipeline A/D converter can be configured such that at least one of the plurality of stages is configured to perform A/D conversion of a plurality of bits.

Hereinafter, embodiments of the present invention will be described with reference to the drawings.

Embodiment 1

Figure 1:
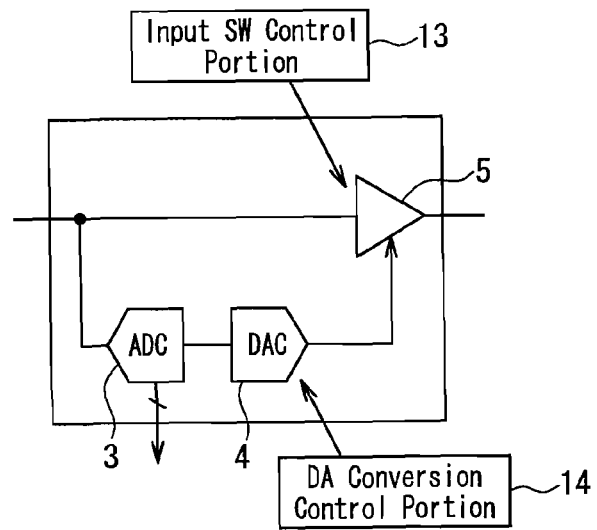
FIG. 1 is a block diagram showing a basic configuration of one stage constituting a pipeline A/D converter in an embodiment 1 of the present invention.
Figure 16:
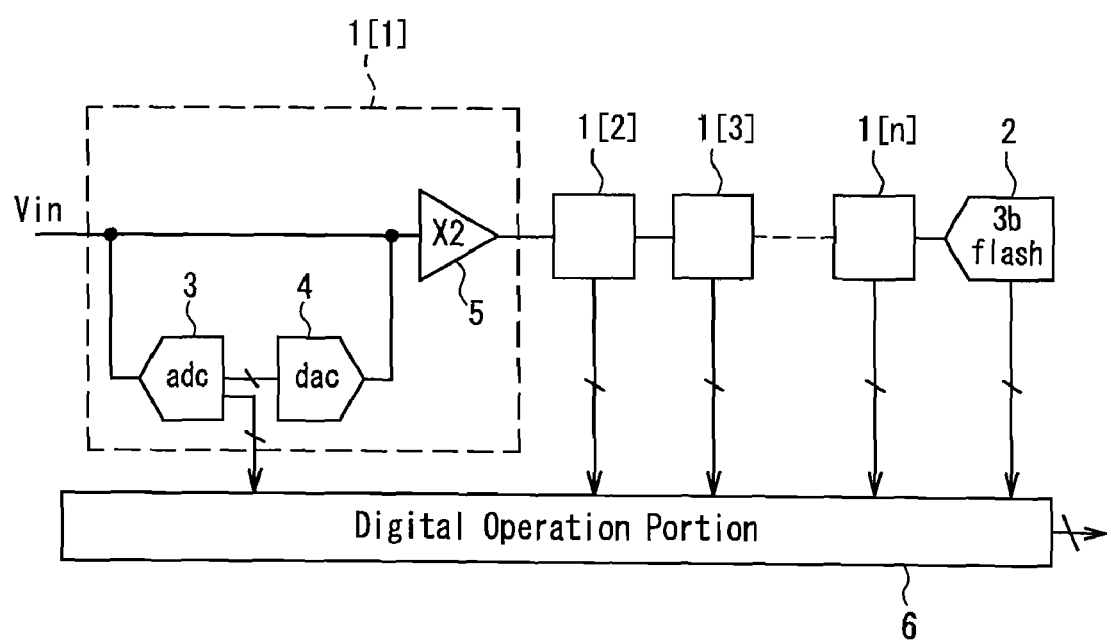
FIG. 16 is a block diagram showing a basic configuration of a conventional pipeline A/D converter.

FIG. 1 is a block diagram of a stage constituting a pipeline A/D converter in an embodiment 1 of the present invention. In this figure, the same reference numerals are given with regard to elements that have the same function as elements of the conventional example shown in FIGS. 16 and 17, and repetitive description will be partially omitted.

This stage is provided with an input SW control portion 13 and a DA conversion control portion 14, in addition to the basic configuration composed of an AD conversion portion 3, a DA conversion portion 4 and a remainder operation portion 5. The input SW control portion 13 controls supply of an input analog signal to the remainder operation portion 5. The DA conversion control portion 14 can control the selection of a reference voltage in the DA conversion portion 4 according to a normal operation mode and a test mode. In the normal operation mode, an analog reference signal is output, and in the test mode, a test signal is output together with the analog reference signal, in place of an input analog signal.

Figure 19:
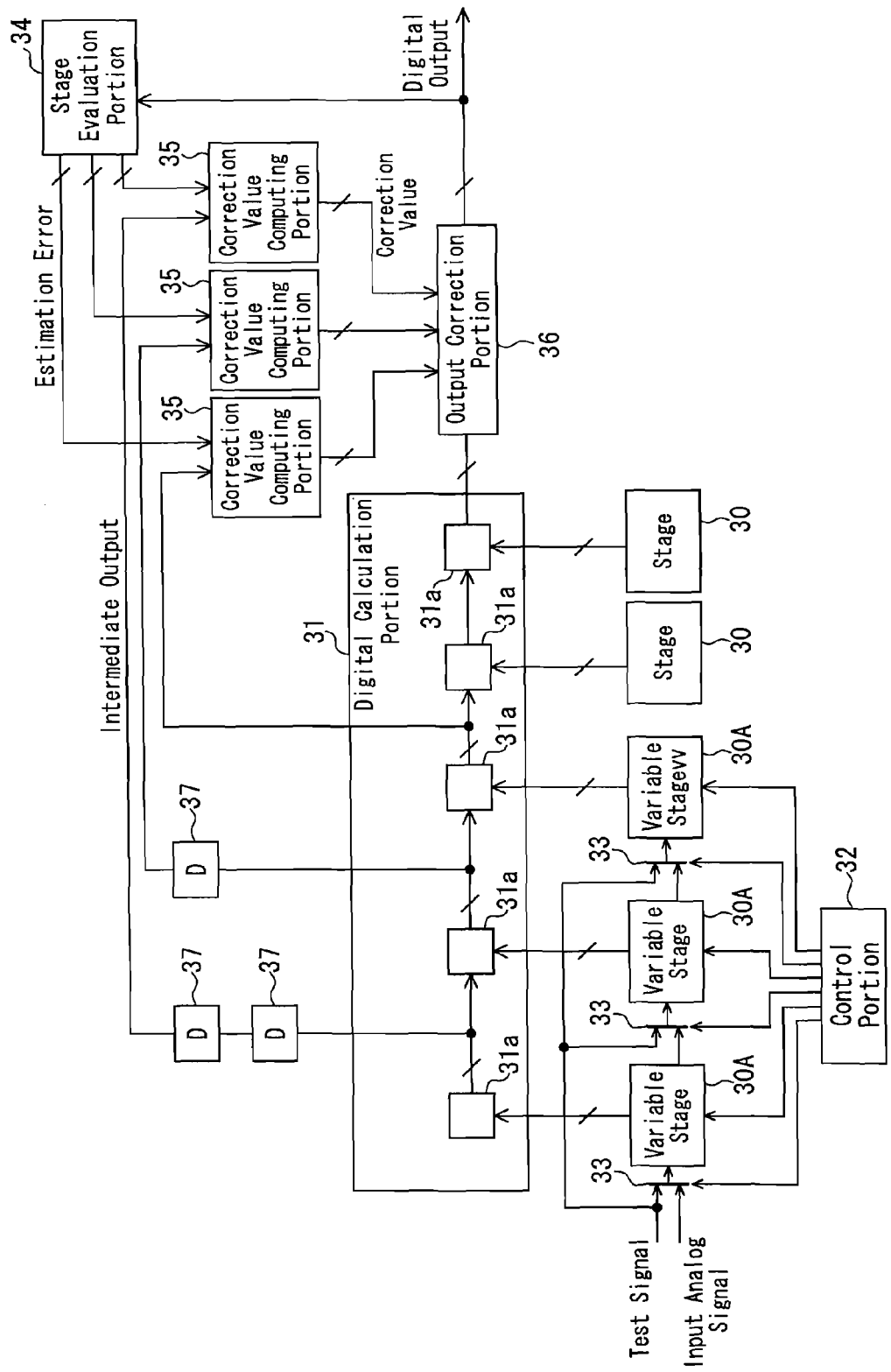
FIG. 19 is a block diagram of a conventional pipeline A/D converter having a configuration for correcting conversion errors.

While illustration thereof is omitted, the pipeline A/D converter of the present embodiment is configured to be capable of performing a test by supplying a test signal to a predetermined stage, like the conventional pipeline A/D converter shown in FIG. 19, for example.

Figure 2:
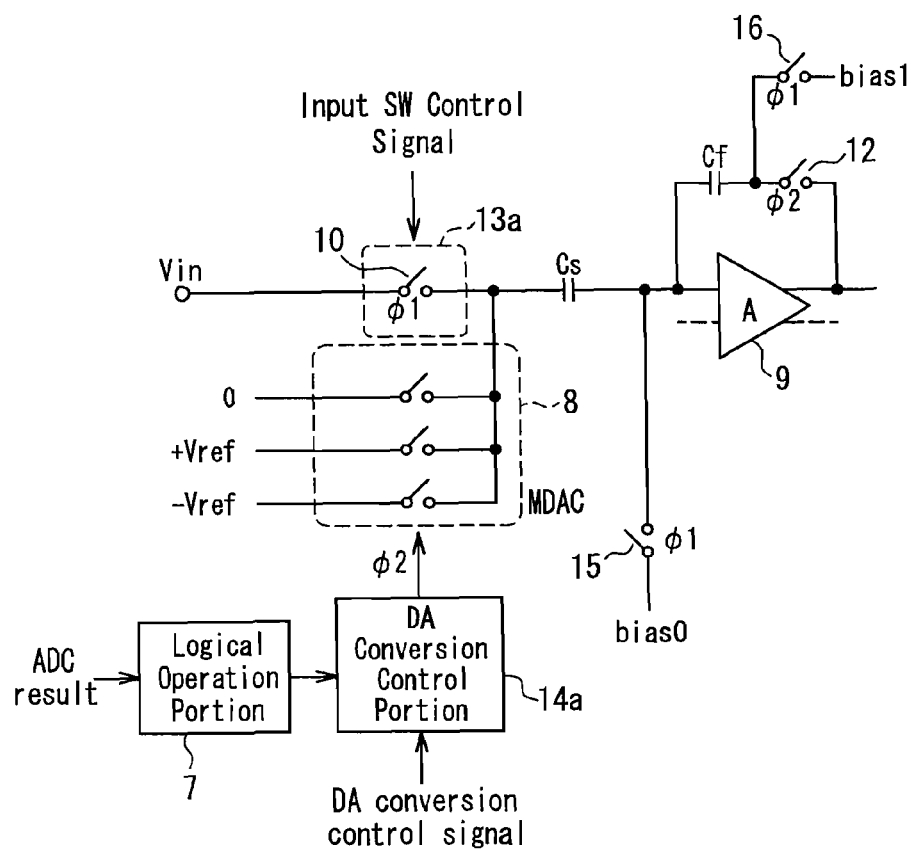
FIG. 2 is a block diagram showing a specific configuration of a main part of the stage.

FIG. 2 is a block diagram showing a more specific configuration, with regard to a portion of the stage shown in FIG. 1, that is, a portion excluding the AD conversion portion 3. Basically, an input SW control portion 13a and a DA conversion control portion 14a are provided in a configuration similar to the conventional example shown in FIG. 17. Also, in place of the switch 12 in FIG. 17, one end of a switch 16 is connected between a feedback loop capacitor Cf and a switch 12, and a bias voltage bias1 is supplied to the other end of the switch 16.

The input SW control portion 13a and the DA conversion control portion 14a operate according to the normal operation mode or the test mode, using control signals respectively supplied thereto. That is, the input SW control portion 13a controls switching of the switch 10 based on an input SW control signal. The DA conversion control portion 14a controls operation of a voltage supply portion 8, based on a DA conversion control signal.

Figure 17:
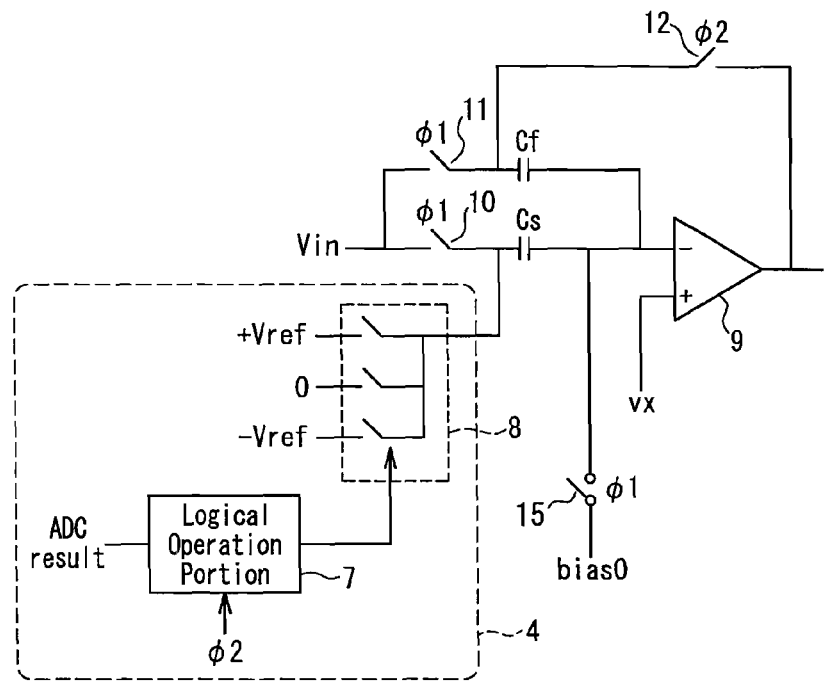
FIG. 17 is a block diagram showing a main part of one stage constituting the pipeline A/D converter.
Figure 18:
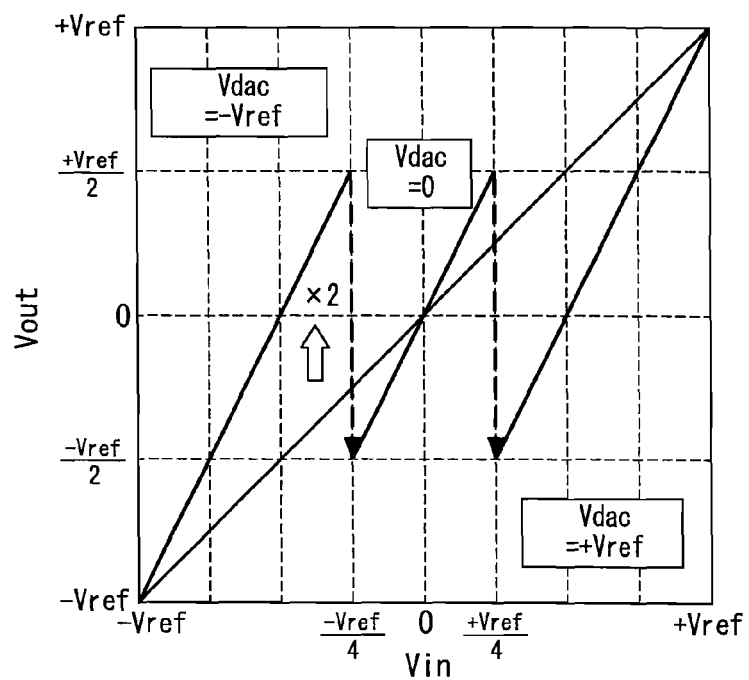
FIG. 18 shows analog input-output characteristics of the stage.

When in the normal operation mode, the switches are controlled similarly to the conventional example described with reference to FIG. 17, using a clock φ1 and a clock φ2, and perform operations of the sampling period and the amplifying period.

Hereinafter, operation in the case of the test mode will be described. When in the test mode, the switch 10 is held in an open state by the input SW control portion 13a, and supply of an input analog signal to a remainder operation portion, that is, the sampling capacitor Cs is blocked. Also, the DA conversion control portion 14a stops the reference voltage selection of the voltage supply portion 8 that is performed based on the output of the logical operation portion 7, selects a reference voltage based on the DA conversion control signal, and supplies the selected reference voltage as a test signal in the sampling period in place of the input analog signal. Similarly, an analog reference signal in the amplifying period also is supplied by selecting a reference voltage based on the DA conversion control signal.

The voltage supply portion 8 is controlled, at the timing of both the dock φ1 and the clock φ2, to select respectively predetermined reference voltages, and supply the selected reference voltages as a test signal and an analog reference signal. The switches 12, 15 and 16 perform operations of the sampling period and the amplifying period according to the clock φ1 and the clock φ2, similarly to the conventional example. Accordingly, at the timing of dock φ1, which is the sampling period, the switches 15 and 16 will be on, and the bias voltage bias0 and the bias voltage bias1 are supplied. At the timing of clock φ2, which is the amplifying period, the switches 15 and 16 will be off, and the switch 12 will be on.

As a result of the above operation, in the sampling period, a predetermined reference voltage is selected by the voltage supply portion 8 and supplied to the sampling capacitor Cs as a test signal, and sampling is performed. Also, in the amplifying period, a predetermined amplification operation is performed by the operational amplifier 9, based on a signal held as a result of the sampling operation and the analog reference signal supplied from the voltage supply portion 8. Accordingly, a test signal and an analog reference signal can be supplied by sharing the voltage supply portion 8 in the normal operation mode and the test mode, without providing a test signal line for supplying test signals. Also, because of the configuration for switching the switches of the voltage supply portion 8 by controlling the DA conversion portion 4 with a DA conversion control signal, a test signal input state can be realized with a small-scale configuration. There is also no need to provide test signal generating means such as a DA converter externally to the pipeline A/D converter.

Figure 3:
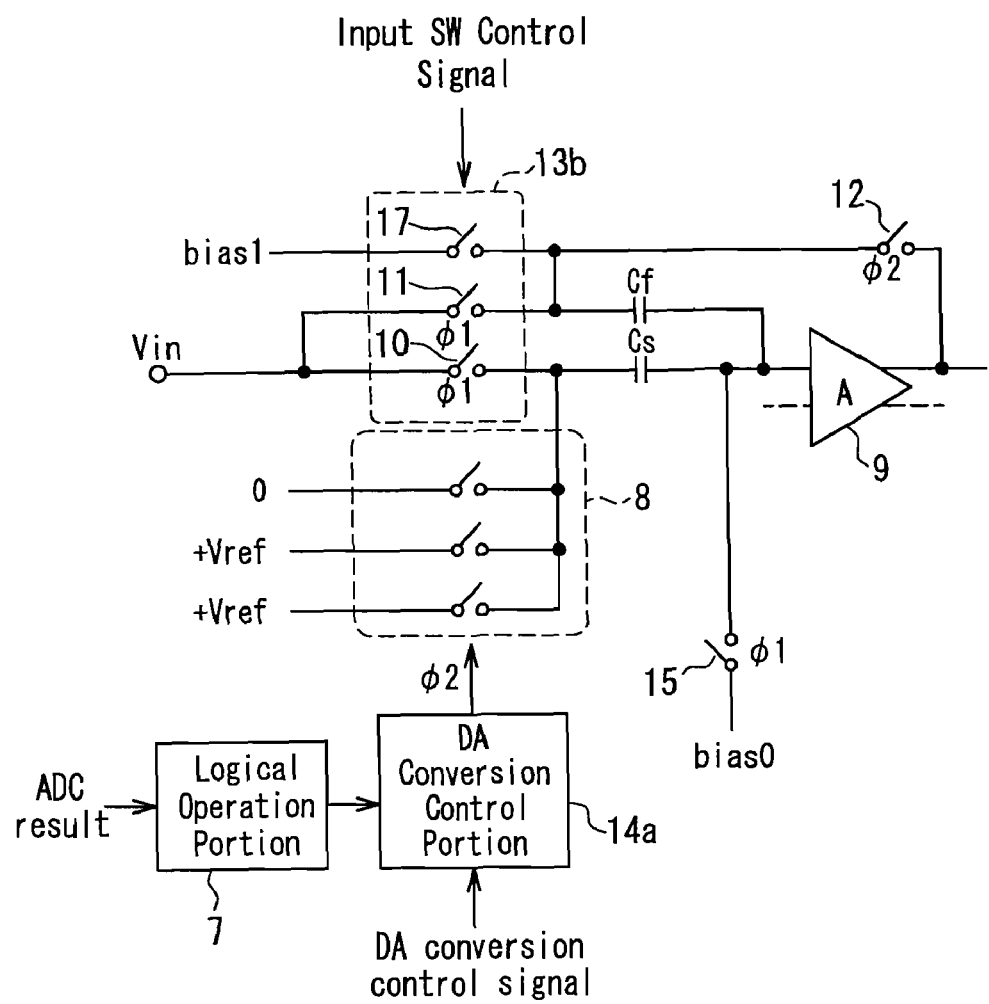
FIG. 3 is a block diagram showing a variation of the stage shown in FIG. 2.

FIG. 3 shows a variation of the configuration in FIG. 2. With this circuit, the disposition of the switches 10 to 12 is similar to the conventional example in FIG. 17. One end of a switch 17 is, however, connected between the feedback loop capacitor Cf and the switch 12, and the bias voltage bias1 is supplied to the other end of the switch 17. Further, the switches 11 and 17 are also under the control of an input SW control portion 13a, in addition to the switch 10. That is, in the normal operation mode, the switch 17 is held in an off state, and the switches 10 and 11 will turn on at the timing of the dock φ1. On the other hand, in the test mode, the switches 10 and 11 are held in an off state, and the switch 17 turns on at the timing of the dock φ1. A configuration such as this is able to perform similar operations to the stage shown in FIG. 2.

Embodiment 2

Figure 4:
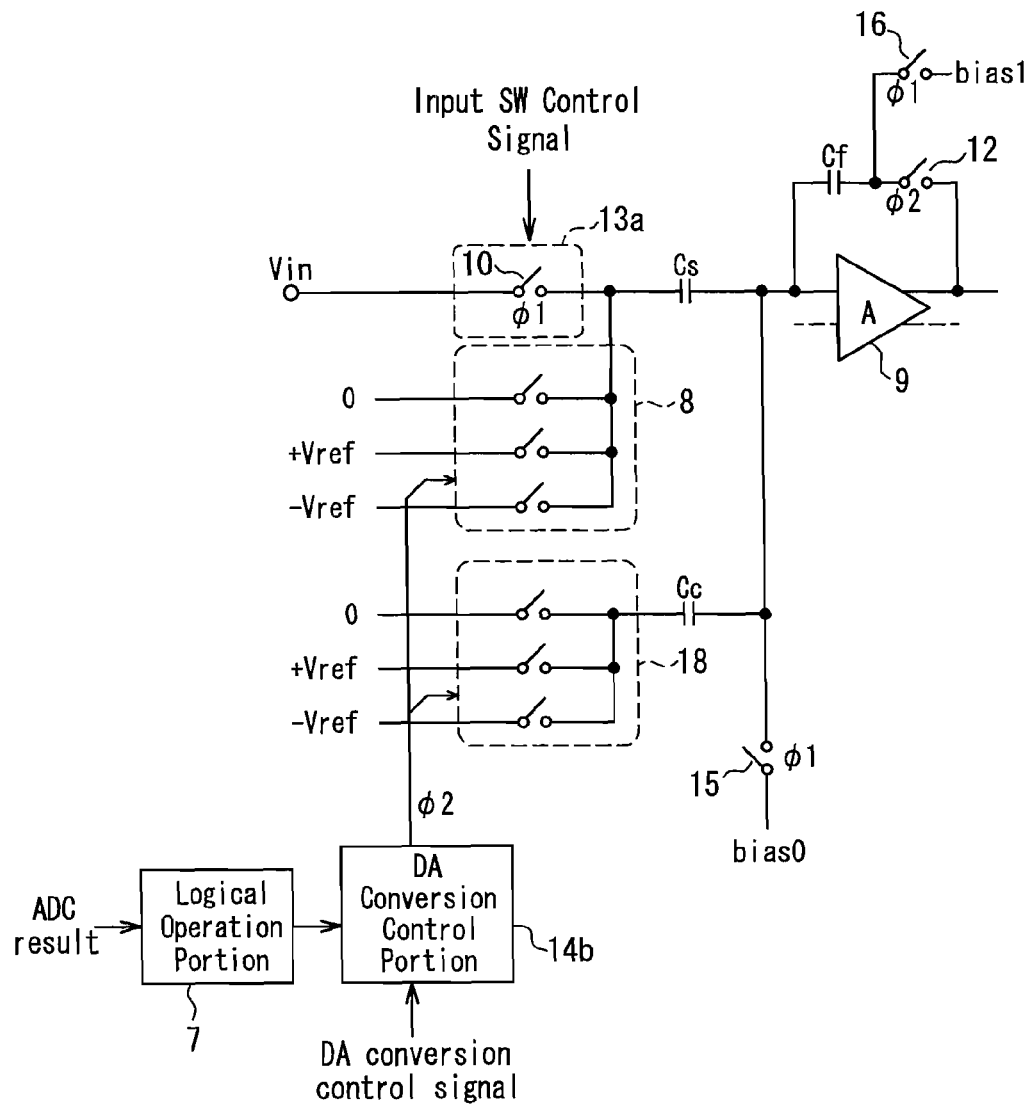
FIG. 4 is a block diagram showing a main part of one stage constituting a pipeline A/D converter in an embodiment 2.

FIG. 4 is a block diagram showing a part of a stage constituting a pipeline A/D converter in an embodiment 2 of the present invention. The same reference numerals are given with regard to elements that are the same as elements of embodiment 1 shown in FIG. 2, and repetitive description will be omitted.

The present embodiment differs from embodiment 1 in that one end of an auxiliary capacitor Cc is connected to an input terminal of the operational amplifier 9. The other end of the auxiliary capacitor Cc, similarly to the sampling capacitor Cs, is connected to an auxiliary voltage supply portion 18, and reference voltages +Vref, 0V and −Vref are supplied thereto by switching three switches.

The voltage supply portion 8 and the auxiliary voltage supply portion 18 are controlled by a DA conversion control portion 14b. That is, when in the test mode, selection of a reference voltage is performed based on the DA conversion control signal, instead of the output of the logical operation portion 7, and a test signal and an analog reference signal are supplied. Accordingly, an input signal to the operational amplifier 9 is a signal obtained by combining analog signals supplied from the voltage supply portion 8 and the auxiliary voltage supply portion 18.

The auxiliary capacitor Cc is set so as to satisfy the following equation (3), where Cc represents the capacitance value of the auxiliary capacitor Cc.

$$Cc = a \times Cs \text{ (or } Cf\text{)} (0 < a \leq 1) \quad (3)$$

Accordingly, even in the case where the same reference voltage is selected by the voltage supply portion 8 and the auxiliary voltage supply portion 18, the signal input to the operational amplifier 9 via the auxiliary capacitor Cc will differ from the signal input via the sampling capacitor Cs. This enables the degree of freedom of the setting values to be improved, with regard to the analog signals supplied using the reference voltages +Vref, 0V and −Vref. A constant a can be set appropriately according to the object of the test.

Figure 5:
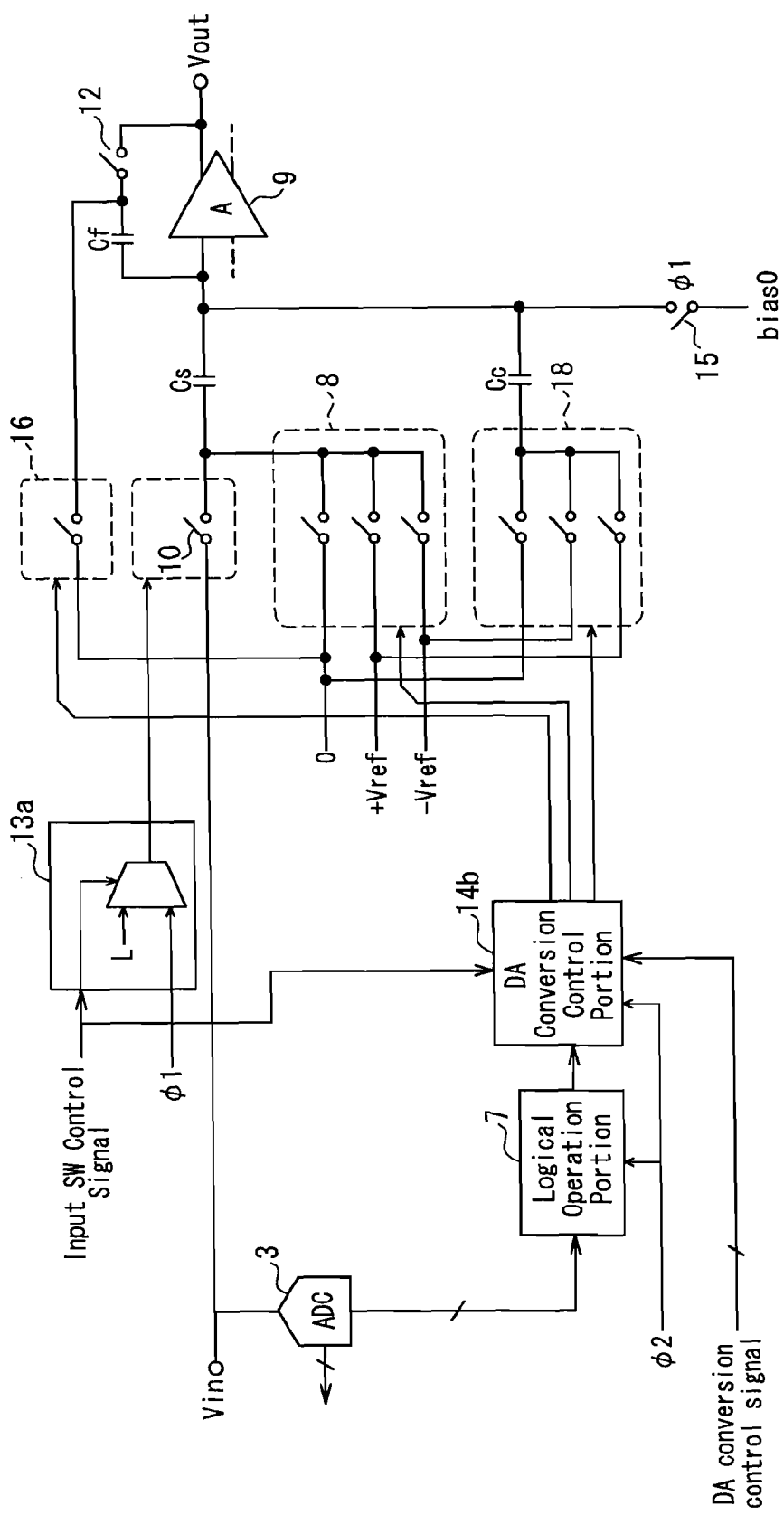
FIG. 5 is a block diagram showing an overall configuration of the stage.

FIG. 5 is a block diagram showing an overall configuration of a stage constituting the pipeline A/D converter in the present embodiment. That is, the AD conversion portion 3 has been added to the configuration shown in FIG. 4, and the connection relationship with the DA conversion control portion 14b is shown. Also, a more specific configuration is shown with regard to the input SW control portion 13a. Further, a reference voltage 0 is supplied as the bias1 via the switch 16, and the switch 16 is controlled by the DA conversion control signal.

Figures 6, 7:
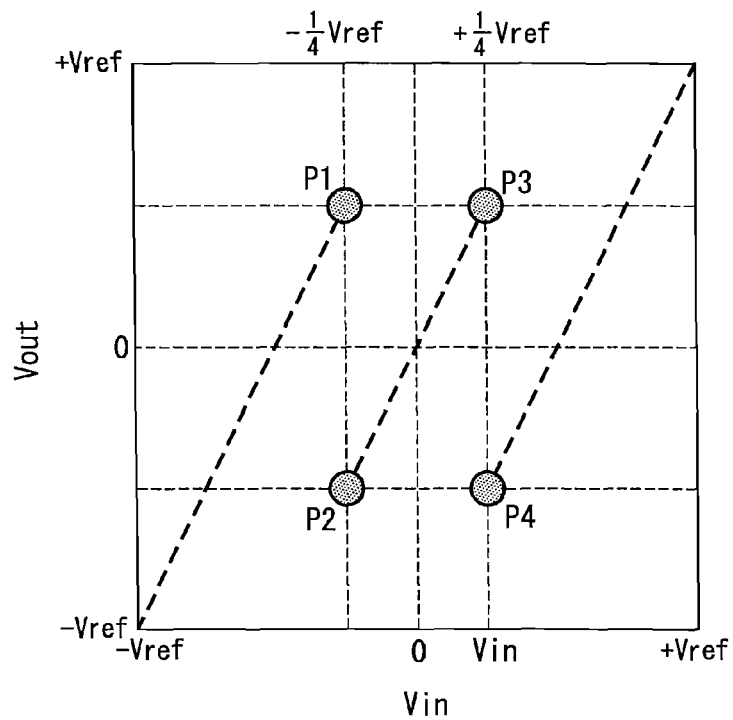
FIG. 6 shows analog input-output characteristics of the stage.
FIG. 7 shows an example of state transitions of the stage in a sampling period and an amplifying period when in a test mode.

Operation of the stage shown in FIG. 5 in the test mode will be described with reference to FIGS. 6 and 7. FIG. 6 shows the analog input-output characteristics of the stage in FIG. 5. Test points P1, P2, P3 and P4 correspond to a maximum value and a minimum value of analog output in a nonlinear portion of the analog input-output characteristics. Because the effect of capacitance value error on analog output signals is greatest at these points, the capacitance value error can be evaluated accurately if a test signal is input under such conditions and a remainder operation is performed. In order to obtain the input-output relation of the four test points P1, P2, P3 and P4 shown in this characteristic diagram, the states of the voltage supply portion 8, the auxiliary voltage supply portion 18 and the switch 16 are controlled as shown in FIG. 7, for example.

FIG. 7 shows an example of state transitions in the sampling period and the amplifying period when in the test mode. That is, control states of the voltage supply portion 8, the auxiliary voltage supply portion 18 and the switch 16 in relation to setting values of a test signal Vin and an analog reference signal Vdac, and values of an analog output signal Vout output from the operational amplifier 9 are shown. The Main, Aux and S fields under the Voltage Supply Portion field respectively indicate control states of the voltage supply portion 8, the auxiliary voltage supply portion 18 and the switch 16. "0" denotes selecting 0V, "+1" denotes selecting +Vref, and "−1" denotes selecting −Vref. The right hand field of the analog output signal Vout indicates the correspondence with the test points P1, P2, P3 and P4 in FIG. 6. Note that Vout in FIG. 7 is an example where the correction capacitor Cc=0.5× Cs.

FIG. 8 contrasts states of the remainder operation portion in the normal operation mode and states of the remainder operation portion in example state transitions in the case of the test points P1 and P2 (test modes 1, 2) shown in FIG. 7. In this way, based on the DA conversion control signal in the test mode, a predetermined reference voltage selected in the voltage supply portion 8 and the auxiliary voltage supply portion 18 can be supplied to the remainder operation portion as a test signal in the sampling period, and a predetermined analog reference signal similarly can be supplied to the remainder operation portion in the amplifying period.

Figure 9:
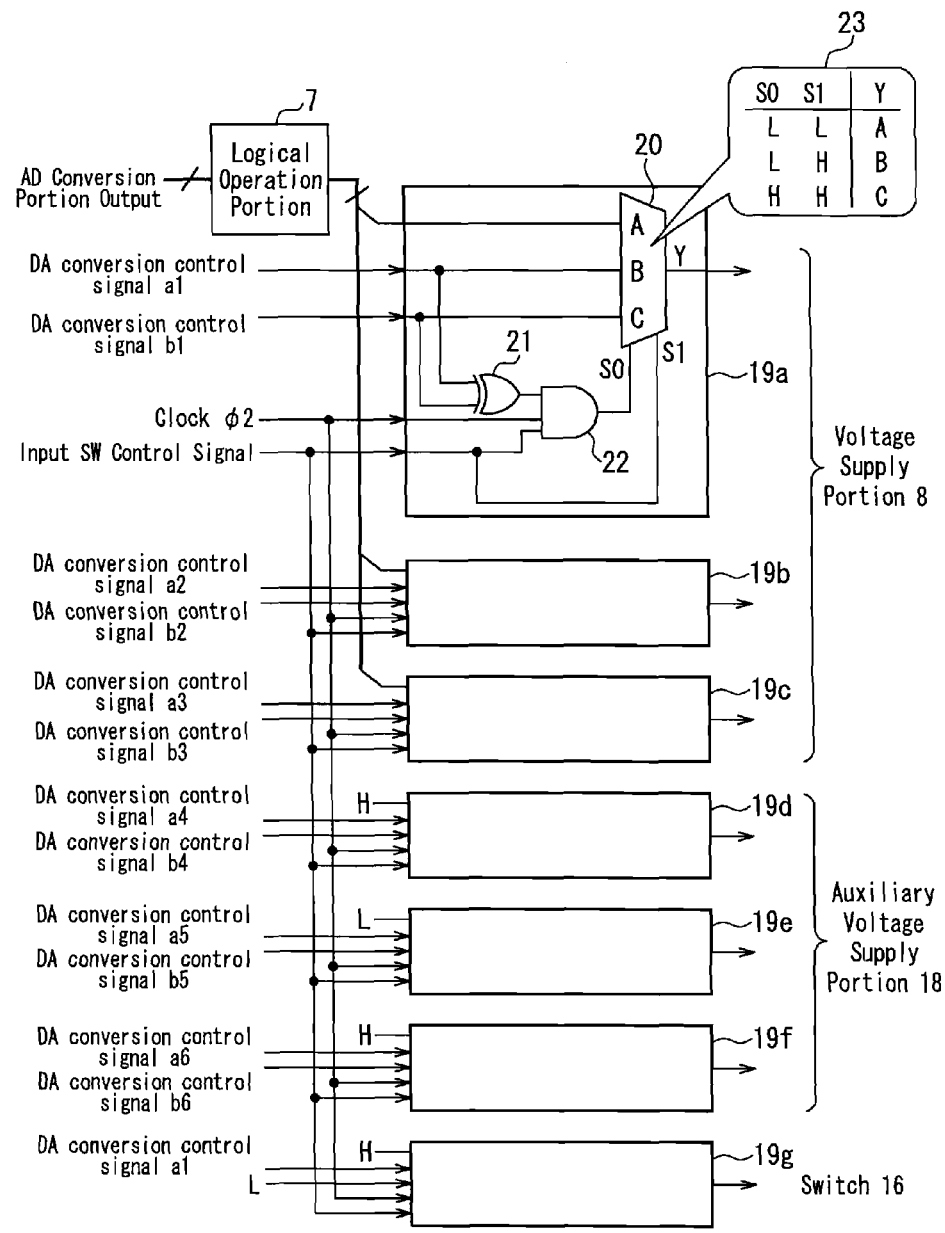
FIG. 9 is a block diagram showing the configuration of a DA conversion control portion in FIG. 5.

FIG. 9 is a block diagram showing the configuration of the DA conversion control portion 14b shown in FIG. 5. The DA conversion control portion 14b is constituted by seven selection control portions 19a to 19g. The selection control portions 19a to 19c respectively output signals for controlling the on/off state of the three switches in the voltage supply portion 8. The selection control portions 19d to 19f respectively output signals for controlling the on/off state of the three switches in the auxiliary voltage supply portion 18. The selection control portion 19g outputs a signal for controlling the on/off state of the switch 16. A specific configuration only is illustrated with regard to the selection control portion 19a. The selection control portion 19a is composed of a selection circuit 20, an EOR gate 21 and an AND gate 22. The other selection control portions 19b to 19g have similar configurations.

Figure 10:
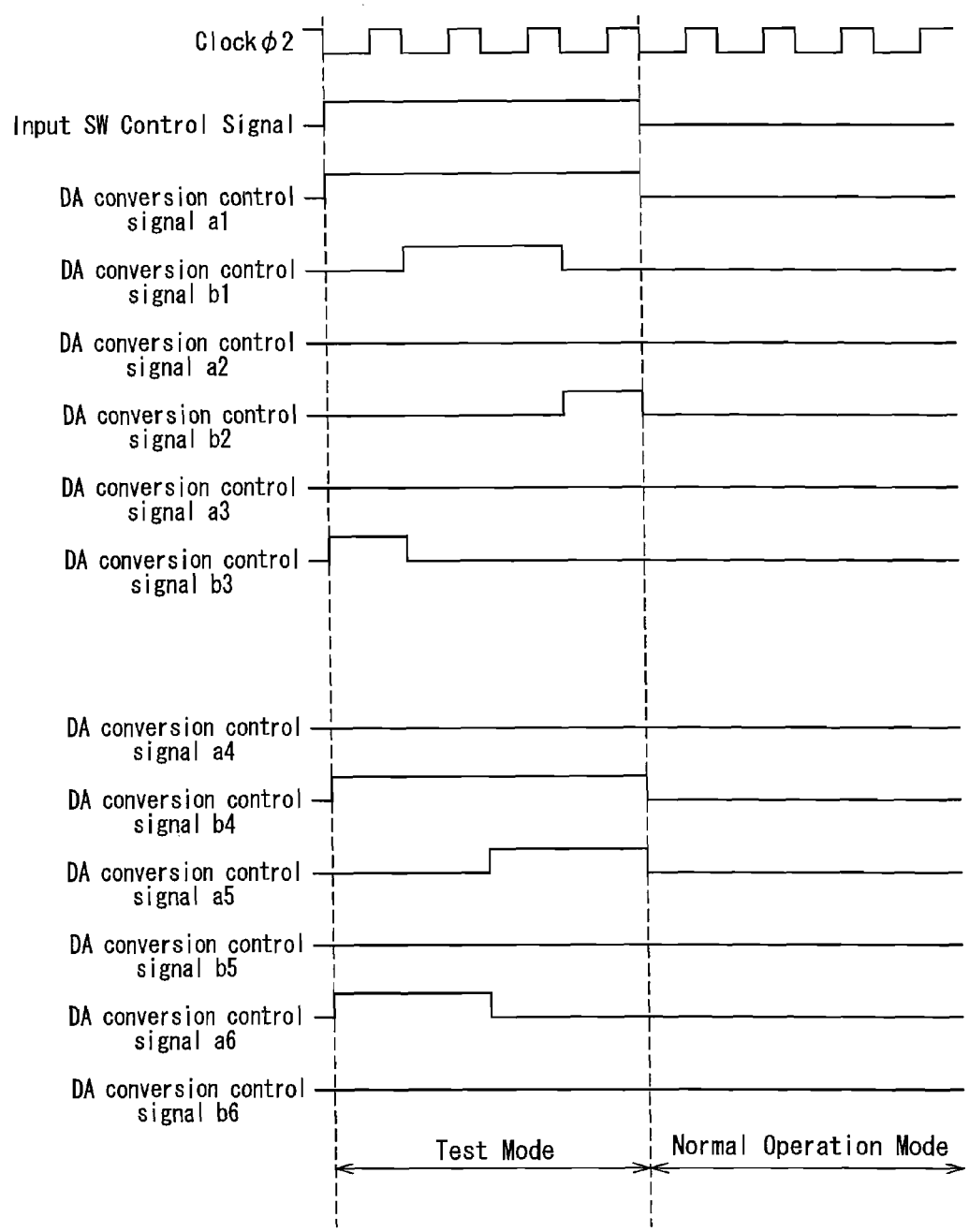
FIG. 10 shows an example of waveforms of control signals supplied to the DA conversion control portion.

DA conversion control signals a1 to a6 input to the selection control portions 19a to 19g are respectively signals for controlling the states of the three switches in the voltage supply portion 8 and the auxiliary voltage supply portion 18 in the sampling period. DA conversion control signals b1 to b6 are respectively signals for controlling the states of the three switches of the voltage supply portion 8 and the auxiliary voltage supply portion 18 in the amplifying period. FIG. 10 shows examples of the waveforms of the clock φ2, the input SW control signal, and the DA conversion control signals a1 to a6 and b1 to b6.

The output of the logical operation portion 7 is input to the input terminal A of the selection circuit 20 in the selection control portions 19a to 19c. H level, L level, H level and H level signals are input respectively to the input terminal A of the selection circuit 20 in the selection control portions 19d to 19g. The DA conversion control signals a1 to a6 are input respectively to the input terminal B of the selection circuit 20 and one of the input terminals of the EOR gate 21 of the selection control portions 19a to 19f. The DA conversion control signal a1 is input to the input terminal B of the selection circuit 20 and one of the input terminals of the EOR gate 21 of the selection control portion 19g. The DA conversion control signals b1 to b6 are input respectively to the input terminal C of the selection circuit 20 and the other of the input terminals of the EOR gate 21 in the selection control portions 19a to 19f. An L level signal is input to the input terminal C of the selection circuit 20 and the other of the input terminals of the EOR gate 21 in the selection control portions 19g.

The output signal of the EOR gate 21, the clock φ2, and the input SW control signal are input to the AND gate 22 of the selection control portions 19a to 19f. An output signal of the AND gate 22 and the input SW control signal are supplied as control signals S0 and S1 of the selection circuit 20. Based on input signals such as the above, the selection circuit 20 in the selection control portions 19a to 19f switches and outputs the input signals of the input terminals A to C with logic such as indicated in a table 23 shown in FIG. 9.

Figure 11:
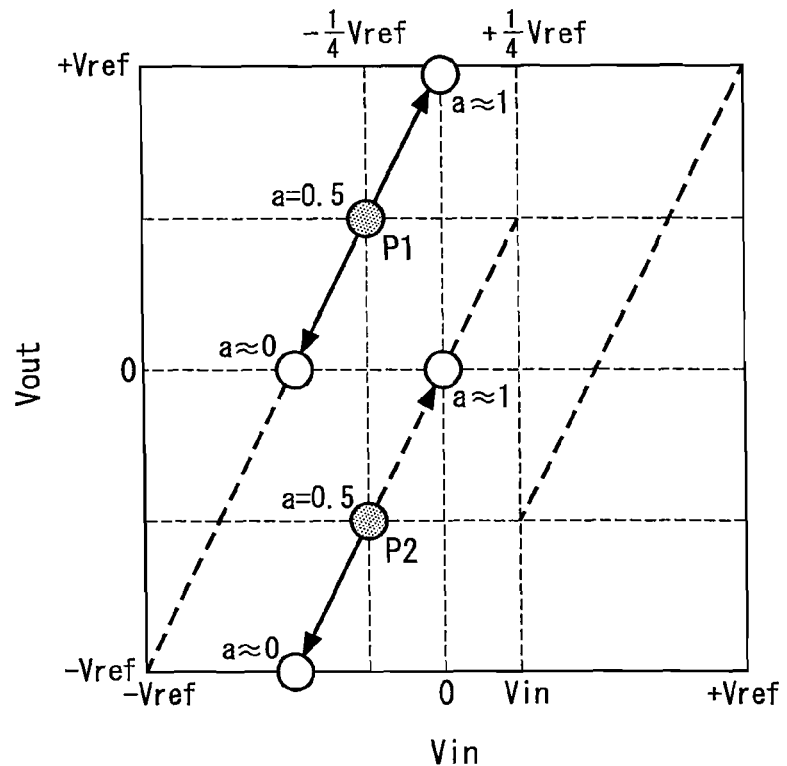
FIG. 11 shows a change in analog input-output characteristics when a capacitance value of an auxiliary capacitor of a stage is changed in embodiment 2.

FIG. 11 shows an example of the change in the analog input-output characteristics when the constant a for determining the capacitance value (Cc=a×Cs) of the auxiliary capacitor Cc is changed, that is, an example of the values that the analog output signal Vout can take. As mentioned above, the degree of freedom of the setting values of the analog input signal supplied to the operational amplifier 9 can be increased, by combining the output of the auxiliary voltage supply portion 18 with the output of the voltage supply portion 8. In FIG. 11, examples of four test points (a≈0 or a≈1) are shown together with the test points P1 and P2 (a=0.5) shown in FIG. 6. In this way, it is possible to supply test signals having setting values that depend on the application, by using the auxiliary voltage supply portion 18.

Figure 12:
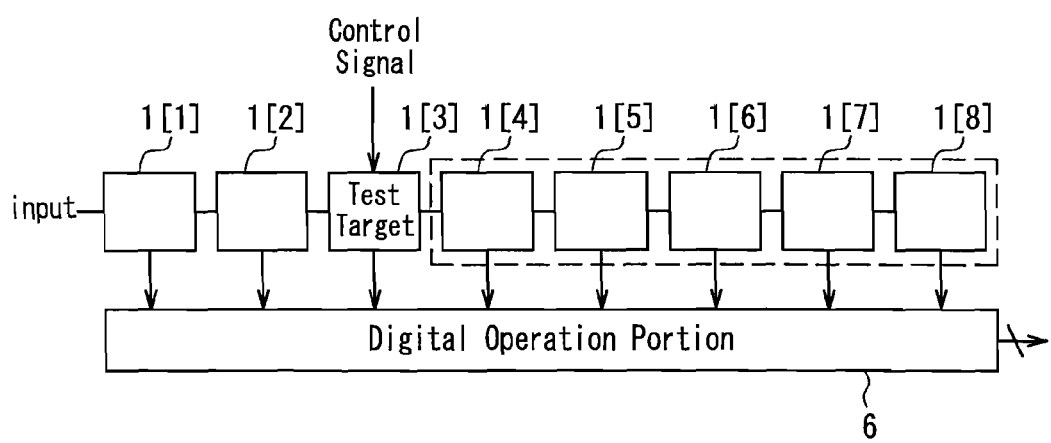
FIG. 12 shows A/D conversion of a pipeline A/D converter constituted by the stages when in a test mode.

FIG. 12 shows the case where an operation is performed by the digital operation portion 6, using the output of the fourth stage onward enclosed with a broken line, with the third stage 1[3] as the test target, in an 8-bit pipeline A/D converter. With a configuration such as mentioned above, the output result will be as follows when a=0.5 is set, and the analog signal of the test point P1 in FIG. 11 is A/D converted.

$2^5 \times (3/4) = 24 [LSB]$

Embodiment 3

A pipeline A/D converter in an embodiment 3 is an example obtained by applying the stage configuration of embodiment 2, in the case where a multi-bit stage configuration is adopted, to enable a test mode operation such as mentioned above.

Figure 13:
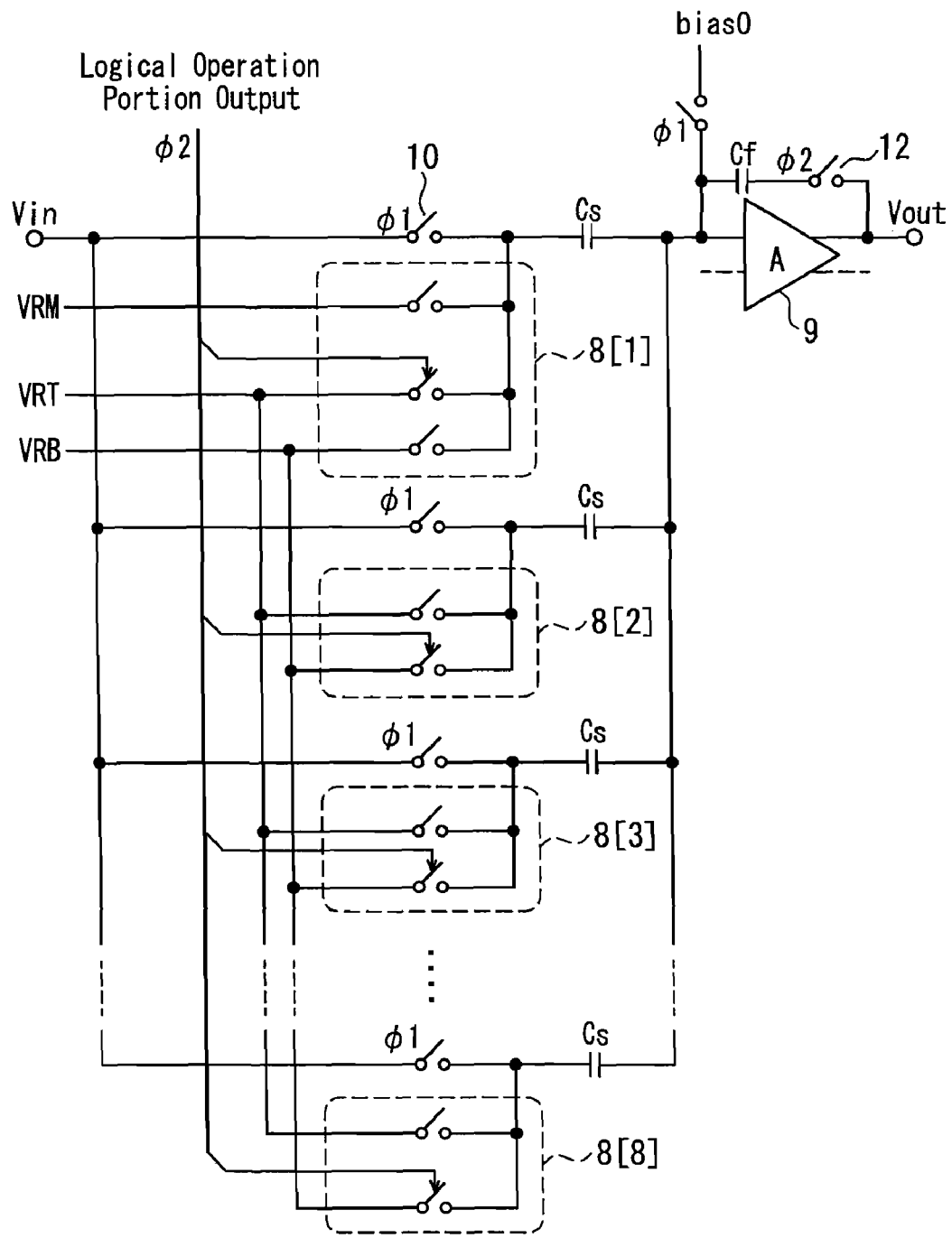
FIG. 13 is a block diagram showing an example of a main part of a stage of a pipeline A/D converter that employs a multi-bit configuration in a first stage.

FIG. 13 shows a main part of an example of a multi-bit stage. With the configuration of this stage, the conversion functions of three normal 1.5-bit stages are consolidated into a single stage. Power consumption in a pipeline system is dominated by the power consumption of the operational amplifiers that exist in the stages. Employing a multi-bit stage configuration is known to be effective in reducing power consumption, because of being able to reduce the number of operational amplifiers.

With the multi-bit stage shown in FIG. 13, eight input capacitors Cs are used and connected to one another in parallel, with an input analog signal Vin being supplied to one end thereof, and the other end being connected to the input terminal of the operational amplifier 9. A switch 10 is inserted at one end of each of the input capacitors Cs. The multi-bit stage is constituted by eight voltage supply portions 8[1] to 8[8], and the logical operation portion output is respectively supplied thereto.

The voltage supply portion 8[1] is constituted so as to selectively output a ternary reference voltage, and includes three switches. Reference voltages VRT, VRB and VRM (=(VRT−VRB)/2) are supplied respectively to the input side of the switches. The voltage supply portions 8[2] to 8[8] are constituted so as to selectively output a binary reference voltage, and include two switches. The reference voltage VRT and the reference voltage VRB are respectively supplied to the input side of the switches. As a result of this configuration, the voltage supply portions 8[1] to 8[8] each selectively output one of the ternary reference voltages VRM, VRT, and VRB or the binary reference voltages VRT and VRB, according to the logical operation portion output.

As a result, a 15-bit analog reference signal Vdac that depends on the output of the AD conversion portion 3 is generated substantively and supplied to the remainder operation portion, by combining the reference voltages individually supplied from the voltage supply portions 8[1] to 8[8] to the eight input capacitors Cs. In the operation of the remainder operation portion, the value of the analog reference signal Vdac is set so as to correspond to input-output characteristics that are based on 15-bit quantization.

Figure 14:
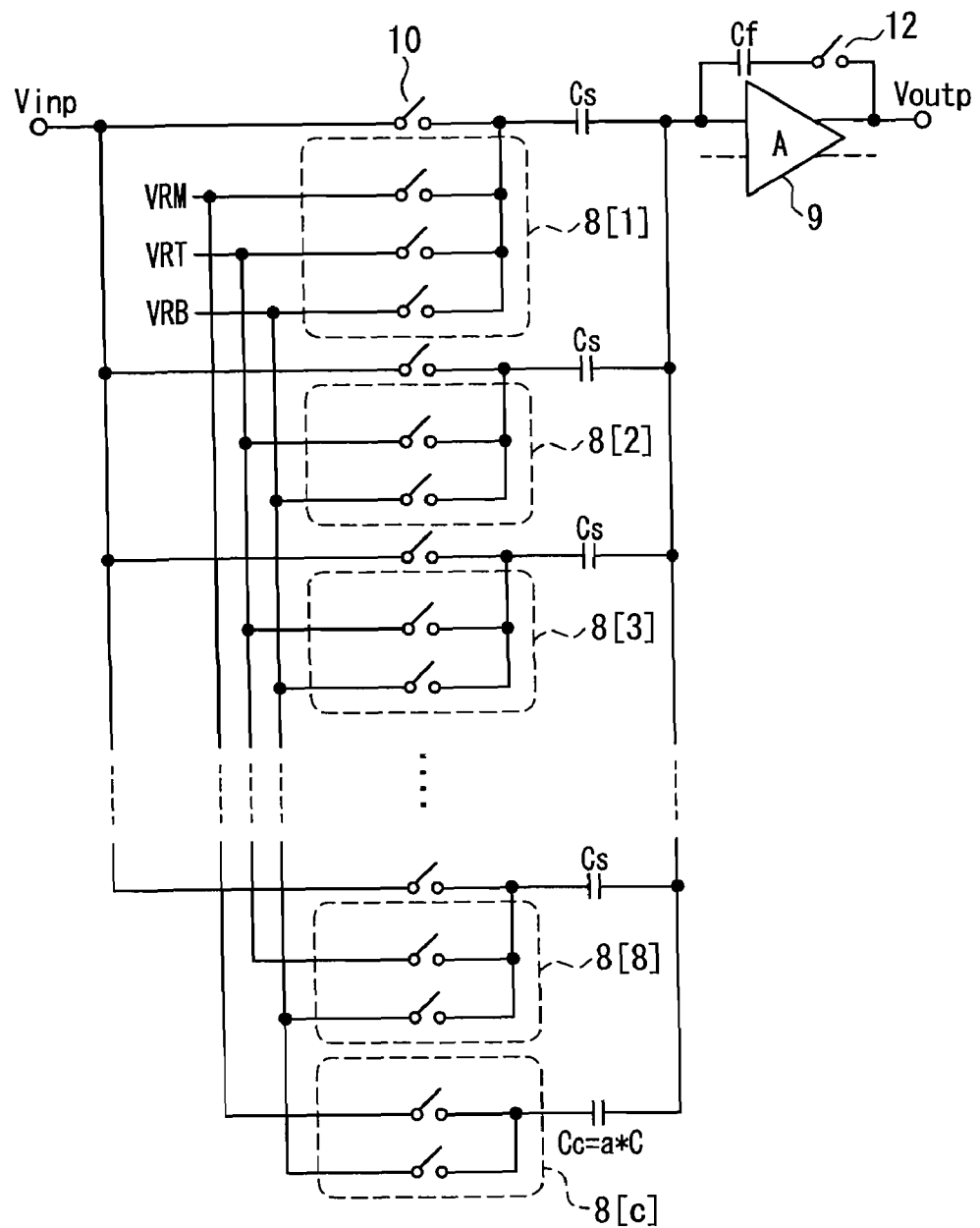
FIG. 14 is a block diagram showing a main part of one stage constituting a pipeline A/D converter in an embodiment 3.

FIG. 14 is a block diagram showing a part of a stage constituting a pipeline A/D converter in the present embodiment. This stage is obtained by applying the stage configuration of embodiment 2 to a multi-bit stage configuration similar to that shown in FIG. 13. An auxiliary voltage supply portion 8[c] has been added to the configuration of FIG. 13. Also, while illustration thereof is omitted, an input SW control portion 13a and a DA conversion control portion 14b are provided, similarly to embodiment 2, and the normal operation mode and the test mode are switched. Also, the voltage supply portions 8[1] to 8[8] and the auxiliary voltage supply portion 8[c] selectively output one of the ternary reference voltages VRM, VRT, and VRB or the binary reference voltages VRT and VRB, according to the logical operation portion output.

FIG. 15 shows an example of state transitions of the multi-bit stage in FIG. 14 in the sampling period and the amplifying period when in the test mode. That is, control states of the voltage supply portions 8[1] to 8[8] and the auxiliary voltage supply portion 8[c] in relation to setting values (relative values) of a test signal Vin and an analog reference signal Vdac, and values of an output signal Vout when an auxiliary capacitor Cc=0.5×Cs are shown. The fields 1 to 8 and c under the Voltage Supply Portion field respectively show control states of the voltage supply portions 8[1] to 8[8] and the auxiliary voltage supply portion 8[c]. "0" denotes selecting VRM, "+1" denotes selecting +Vref, and "−1" denotes selecting −Vref.

As described above, applying the configuration of the present invention to a multi-bit stage configuration also enables a test signal supplied to a stage in order to perform various types of tests to be input with a small-scale configuration, without providing a test signal line separately to a line used for normal operation.

A pipeline A/D converter of the present invention, being able to accurately supply test signals and being capable of suppressing any increase in circuit size, is useful as a pipeline A/D converter used in the fields of audiovisual, information communications and the like.

What is claimed is:

1. A pipeline A/D converter having a plurality of stages connected in cascade, each of which performs A/D conversion corresponding to a portion of bits, such that an analog signal input to a first one of the stages is converted to a digital signal sequentially from a most significant bit to a least significant bit through the plurality of stages, each of the stages comprising:

an AD conversion portion that generates a digital signal corresponding to a portion of bits by quantizing an input analog signal of the stage;

a DA conversion portion comprising a voltage supply portion that selects a reference voltage from reference voltages of a plurality of levels and outputs the selected reference voltage, and a logical operation portion that outputs a signal for controlling selection by the voltage supply portion based on the digital signal generated by the AD conversion portion, thereby outputting the selected reference voltage as an analog reference signal; and a remainder operation portion that generates a remainder analog signal by performing addition/subtraction of the analog reference signal with respect to the input analog signal and amplification by a predetermined factor, and supplies the remainder analog signal to a next one of the stages as an input analog signal, which is configured such that a test can be performed by supplying a test signal in place of the input analog signal, with respect to at least a portion of the stages, the pipeline A/D converter further comprising: a control portion capable of controlling supply of the input analog signal to the remainder operation portion and selection of the reference voltage by the DA conversion portion, according to a normal operation mode and a test mode, respectively, wherein the remainder operation portion comprises an input switch that controls input of the input analog signal, an operational amplifier, a sampling capacitor, one end of which is connected to an input terminal of the operational amplifier and another end of which is connected to the input switch, and a feedback loop capacitor connected between the input terminal and an output terminal of the operational amplifier via a feedback changing switch, and DA conversion portion comprises an auxiliary voltage supply portion that selects and outputs a reference voltage from the reference voltages of the plurality of levels, and an auxiliary capacitor, one end of which is connected to the input terminal of the operational amplifier and another end of which is connected to the auxiliary voltage supply portion, wherein the control portion is capable of selecting one of the output signal of the logical operation portion and the DA conversion control signal, so as to control the reference voltage selection by the voltage supply portion using one of the signals, and performs control, in the test mode, to stop supply of the input analog signal to the remainder operation portion by turning off the input switch and stop the reference voltage selection of the DA conversion portion based on the digital signal as well, while performing reference voltage selection based on the DA conversion control signal for use in testing, thereby supplying a downstream path of the input switch in the remainder operation portion with the test signal composed of predetermined one of the reference voltages, in place of the input analog signal, and the analog reference signal, and wherein when in the test mode, the control portion performs control so as to supply output voltages of the voltage supply portion and the auxiliary voltage supply portion to the remainder operation portion, during a sampling period of the remainder operation portion in the test mode, the control portion performs control to sample the test signal using the sampling capacitor, while controlling the feedback changing switch to be off, and during an amplifying period of the remainder operation portion in the test mode, the control portion performs control to input the selected analog reference signal to the sampling capacitor, while controlling the feedback changing switch to be on, thereby performing a predetermined operation between the sampled test signal and the analog reference signal.

2. The pipeline A/D converter according to claim 1, further comprising:
a bias switching switch, one end of which is connected between the feedback loop capacitor and the feedback changing switch, and another end of which is connected to a bias voltage,
wherein the control portion controls the bias switching switch to be on during the sampling period of the remainder operation portion when in the test mode.

3. The pipeline A/D converter according to claim 2,
wherein a capacitance value Cc of the auxiliary capacitor satisfies a relation $Cc=a \times Cs$ or $Cc=a \times Cf$ (a being a constant where $0<a \leqq 1$), with respect to a capacitance value Cs of the sampling capacitor or a capacitance value Cf of the feedback loop capacitor.

4. The pipeline A/D converter according to any one of claim 2,
wherein at least one of the plurality of stages is configured to perform A/D conversion of a plurality of bits.

5. The pipeline A/D converter according to claim 1,
wherein a capacitance value Cc of the auxiliary capacitor satisfies a relation $Cc=a \times Cs$ or $Cc=a \times Cf$ (a being a constant where $0<a \leqq 1$), with respect to a capacitance value Cs of the sampling capacitor or a capacitance value Cf of the feedback loop capacitor.

6. The pipeline A/D converter according to any one of claim 5,
wherein at least one of the plurality of stages is configured to perform A/D conversion of a plurality of bits.

7. The pipeline A/D converter according to any one of claim 1,
wherein at least one of the plurality of stages is configured to perform A/D conversion of a plurality of bits.

* * * * *